United States Patent [19]

Flohrs

[11] Patent Number: 4,599,638

[45] Date of Patent: Jul. 8, 1986

[54] PLANAR SEMICONDUCTOR STRUCTURE BREAKDOWN VOLTAGE PROTECTION USING VOLTAGE DIVIDER

[75] Inventor: Peter Flohrs, Reutlingen-Betzingen, Fed. Rep. of Germany

[73] Assignee: Robert Bosch GmbH, Stuttgart, Fed. Rep. of Germany

[21] Appl. No.: 541,333

[22] PCT Filed: Sep. 3, 1982

[86] PCT No.: PCT/DE82/00175

§ 371 Date: Sep. 15, 1983

§ 102(e) Date: Sep. 15, 1983

[87] PCT Pub. No.: WO83/02529

PCT Pub. Date: Jul. 21, 1983

[30] Foreign Application Priority Data

Jan. 20, 1982 [DE] Fed. Rep. of Germany ....... 3201545

[51] Int. Cl.[4] .......................................... H01L 27/02
[52] U.S. Cl. .......................................... 357/51; 357/13; 357/52; 357/86; 357/34; 357/43; 357/53
[58] Field of Search .................... 357/13, 13 U, 13 Z, 357/13 LM, 52, 52 D, 51, 86, 34, 43, 53

[56] References Cited

U.S. PATENT DOCUMENTS

| | | | |
|---|---|---|---|
| 3,243,669 | 3/1966 | Sah | 357/53 X |
| 3,710,204 | 1/1973 | Batz . | |
| 3,949,120 | 4/1976 | Liebfried et al. . | |
| 4,037,245 | 7/1977 | Ferro | 357/86 X |
| 4,106,048 | 8/1978 | Khajezadeh | 357/13 X |
| 4,157,563 | 6/1979 | Bosselnar . | |
| 4,437,107 | 3/1984 | Jonsson et al. | 357/52 X |
| 4,482,911 | 11/1984 | Quorin | 357/86 X |

FOREIGN PATENT DOCUMENTS 6413894 8/1965 Netherlands .......................... 357/53
1348697 3/1974 United Kingdom .

Primary Examiner—Andrew J. James
Assistant Examiner—William Mintel
Attorney, Agent, or Firm—Frishauf, Holtz, Goodman & Woodward

[57] ABSTRACT

A planar semiconductor structure is proposed which has a monocrystalline semiconductor chip (10) of a specific conductivity type, a first zone (11) of the opposite conductivity type introduced into the semiconductor chip (10) by diffusion from a main surface and together with the material making up the semiconductor chip (10) forming a p-n junction (12), and a passivation layer (13) covering this same main surface of the semiconductor chip (10) with the exception of contact windows. A second, annular zone (14) acting as a stop ring and having the same conductivity type as the basic material making up the semiconductor chip (10) but a higher concentration of impurities is introduced into the semiconductor chip (10) from the same main surface such that it surrounds the first zone (11). A metallizing coating acting as a cover electrode (15) is applied to the passivation layer (13), surrounding the p-n junction (12) annularly and overlapping the line of intersection of this junction with the main surface of the semiconductor chip (10). This metallizing coating extends into the region above the annular zone (14). The potential of the cover electrode (15) is adjustable such that it is between the potential of the first zone (11) and the potential of a portion of the semiconductor chip (10) located outside the first zone (11) and having a conductivity type opposite that of the first zone (11). In order to adjust the potential at the cover electrode (15), a voltage divider (16) is provided (FIG. 1).

11 Claims, 6 Drawing Figures

PLANAR SEMICONDUCTOR STRUCTURE BREAKDOWN VOLTAGE PROTECTION USING VOLTAGE DIVIDER

STATE OF THE ART

The invention relates to a planar semiconductor structure having a main surface of a specific conductivity type, at least one annular zone produced by diffusion into the main surface, a passivation layer, and a cover electrode. Semiconductor structures of this kind are already known. However, they have the disadvantage that electrical fields affecting them from outside, such as are produced by the polarisation of cover lacquers during high-voltage and high-temperature operation, can cause the degradation of blocking characteristics, or that the breakdown voltage can be affected only by varying the thickness of the passivation layer within certain limits but cannot be varied after the metallizing coating is applied.

ADVANTAGES OF THE INVENTION

Briefly, the semiconductor structure according to the invention and having an annular zone acting as a stop-ring and a cover electrode, with an adjustable potential, extending over the stop-ring has the advantage over the prior art that the space charge zone forming around the first zone during operation is confined inside the annular zone acting as a stop ring and is shielded from external electrical fields beneath the cover electrode, and that, furthermore, the breakdown voltage at the first p-n junction is variable within wide limits. Claim 2 affords a particularly simple possible realization of the adjustment of this breakdown voltage with the aid of a voltage divider. Particularly advantageous further developments of the subject of claims 1 and 2 are disclosed in the further dependent claims 3–12.

DRAWING

Exemplary embodiments of the semiconductor structure according to the invention are shown in the drawing and described in greater detail in the ensuing description. Shown are:

FIG. 1, a section through a planar semiconductor structure according to the invention, having an external ohmic voltage divider for adjusting the breakdown voltage at the first p-n junction;

FIG. 2, the breakdown voltage $U_{Br}$ at the first p-n junction in accordance with the divider ratio of this external voltage divider;

FIG. 3, a plan view on a semiconductor structure according to the invention, in which the ohmic voltage divider is monolithically integrated;

FIG. 4, a section taken along the line A—A' of FIG. 3;

FIG. 5, a plan view on a portion of a semiconductor structure according to the invention, in which the ohmic voltage divider is partially replaced by a chain of Zener diodes; and FIG. 6, a section taken along the line B—B' of FIG. 5.

DESCRIPTION OF THE EXEMPLARY EMBODIMENTS

The intention is that a planar p-n junction 12 be protected by means of a metal electrode 15 above the insulator 13 such that the blocking behavior cannot be affected in an undesirable manner by external influences (such as substances with polar groups, alkali ions, metal flakes and the like).

Figure 1:
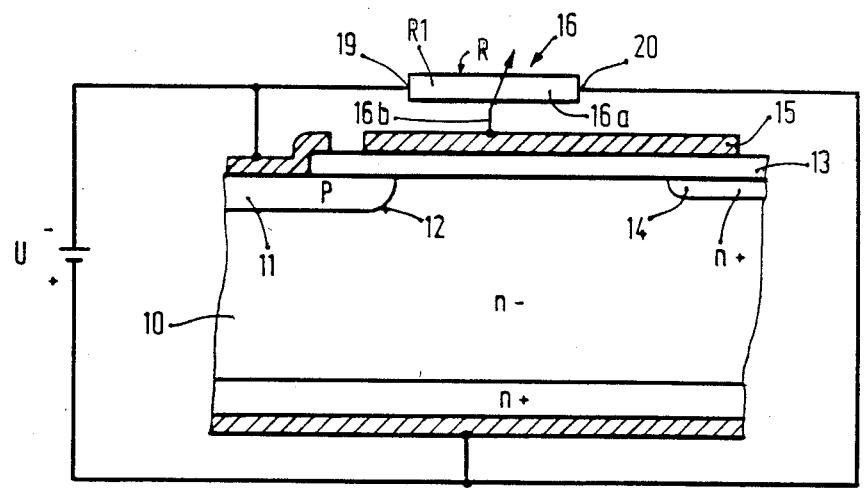

FIG. 1 shows an exemplary embodiment in schematic form. The semiconductor chip 10 comprises $n^-$-conductive silicon; the insulator 13 is of thermally grown silicon dioxide. The metal electrode 15 overlaps the p zone 11 and an $n^+$ zone 14, which in an n-p-n transistor can be introduced by diffusion simultaneously with the emitter. The $n^+$-conductive emitter zone of the n-p-n transistor is not shown in FIG. 1, however, so the structure of FIG. 1 must be conceived of as a Zener diode. The attainable breakdown voltage is dependent not only on the basic doping of the silicon but also, substantially, on the thickness of the oxide layer 13 and on the potential of the electrode 15.

Figure 2:
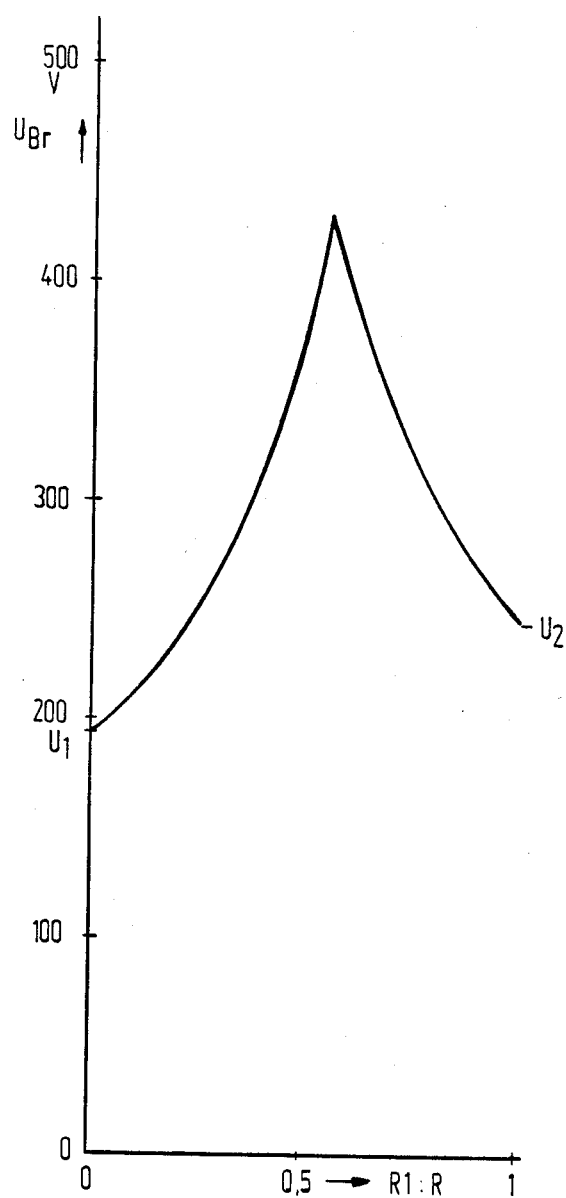

FIG. 2 shows the dependency of the breakdown voltage as a function of the divider ratio $R_1$: R of an external voltage divider 16. $U_1$ is the breakdown voltage obtained if the cover electrode 15 is connected directly to the p zone 11. In the present exemple, it is markedly lower than the breakdown voltage that is attainable without a cover electrode 15. It is equal to the voltage upon the depletion breakdown of a corresponding metal oxide semiconductor structure. $U_2$ is the breakdown voltage upon the connection of the cover electrode 15 to the $n^+$ zone 14 or the collector zone of an n-p-n transistor. On account of the field strength increase dictated by the charge carrier enrichment, this voltage $U_2$ is likewise lower than the breakdown voltage without a cover electrode 15. The highest attainable breakdown voltage amounts to $U_1+U_2$ at a divider ratio $R_1:R=U_2:(U_1+U_2)$. The effect of temperature on the breakdown voltage is somewhat less in a transistor than in a Zener diode with the same blocking voltage, especially if the voltage divider 16 is adjusted to the right-hand edge of the voltage curve in FIG. 2.

Figure 4:
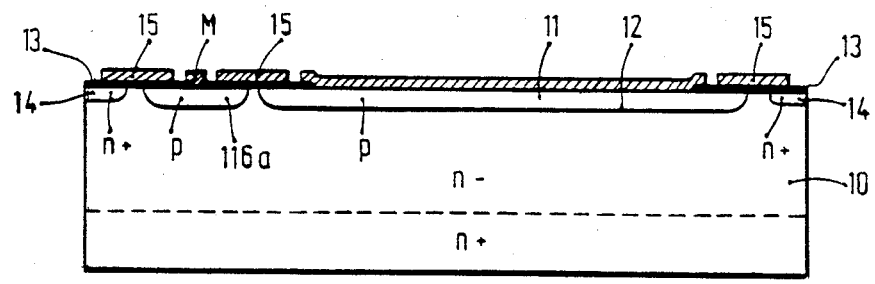
Figure 3:
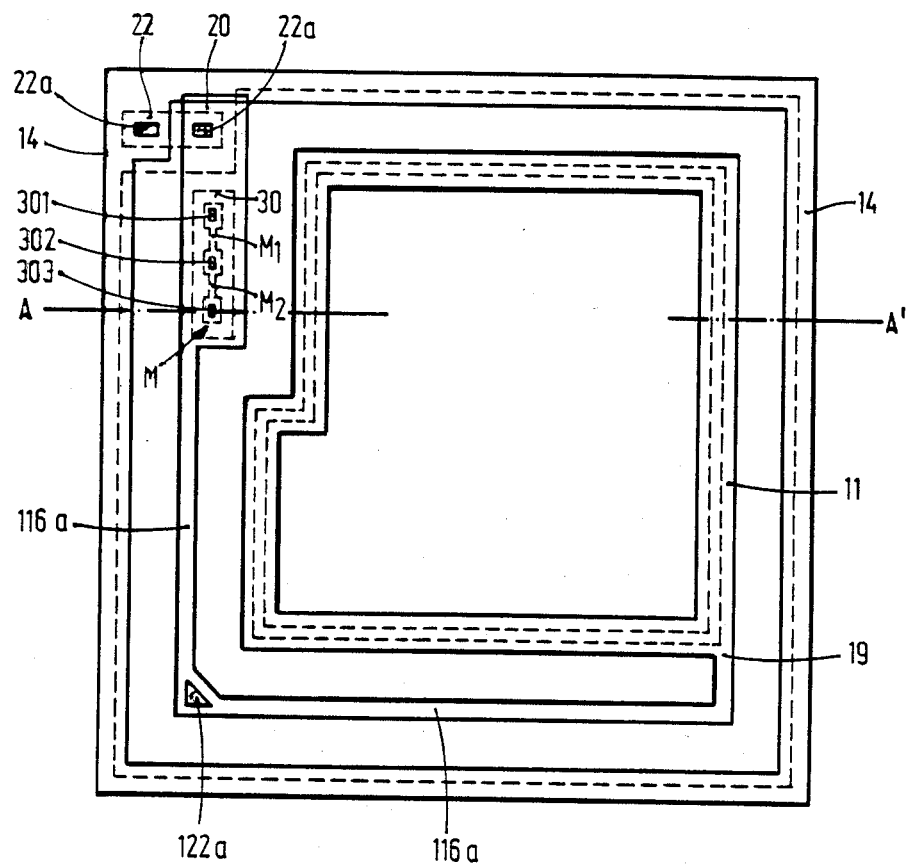

FIGS. 3 and 4 show one example of how the voltage divider 16 can be monolithically integrated. As seen in the plan view of FIG. 3, the voltage divider resistor 16a (shown schematically in FIG. 1) forms an elongated p-conductive third zone 116a introduced by diffusion from the main surface of the semiconductor chip 10. This third zone 116a comprises an offshoot of the first zone 11 and is covered at least partially by the passivation layer 13 and by the metallizing coating extending beyond it and acting as the cover electrode 15. The edge of all the metallizing coatings is indicated by dashed lines in FIG. 3. At a specific location above the third zone 116a, the passivation layer 13 is removed beneath the cover electrode 15. The portion of the cover electrode coming to rest inside the contact window 122a thus formed thereby forms the tap 16b of the voltage divider 16. The first end 19 of the voltage divider resistor 16a is located in FIG. 3 on the lower right corner of the first zone 11 and furnishes a gap-free transition between the first zone 11 and the third zone 116a. The second end 20 of the voltage divider resistor 16a is formed by the other end of the third zone 116a, which in FIG. 3 is located somewhat to the right of the upper left corner of the semi-conductor chip 10. This second end 20 of the voltage divider resistor 16a formed by the third zone 116a is connected, by means of a metallizing coating 22 carried beyond the passivation layer 13, with a portion of the stop ring 14, in such a manner that this metallizing coating 22 is bonded via contact windows 122a disposed in the passivation layer 13 to the areas located beneath these windows and which are to be connected with one another. A recess 30 which exposes the passivation layer 13 is disposed in the cover electrode 15 over the upper left portion of the third zone 116a. Contact windows 301, 302, 303 are introduced into the portion of the passivation layer 13 exposed by the recess 30, disposed in a row in the longitudinal direction of the third zone 116a. These contact windows 301, 302, 303 are bridged over by a short-circuiting metallizing coating M, which short-circuits the portions of the third zone 116a located between these contact windows 301, 302, 303. By severing individual pieces $M_1$, $M_2$ of this short-circuiting metallizing coating M, the voltage divider 16 can be balanced in order to be able to adjust the breakdown voltage at the first p-n junction 12 to a desired value. A suitable method for severing such metallizing bridges is described in German examined patent application DE-AS No. 22 56 688.

Figure 5:
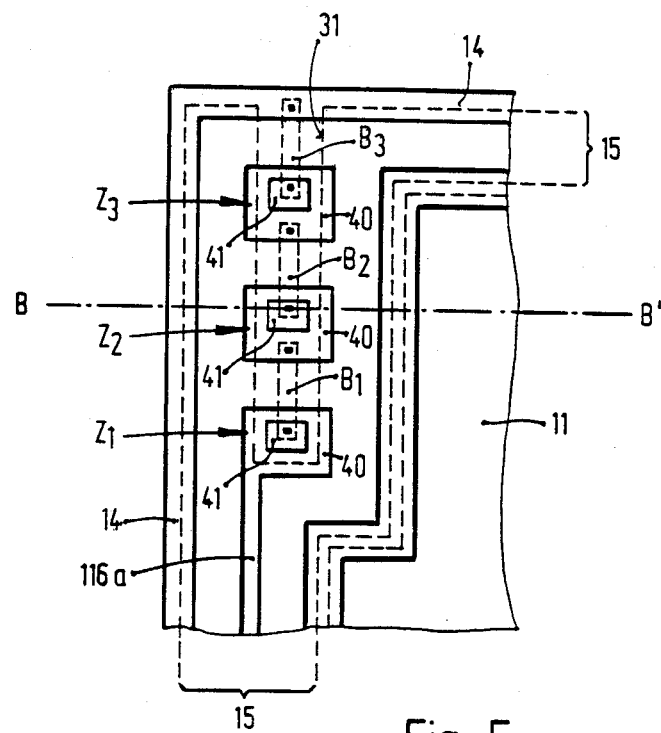
Figure 6:
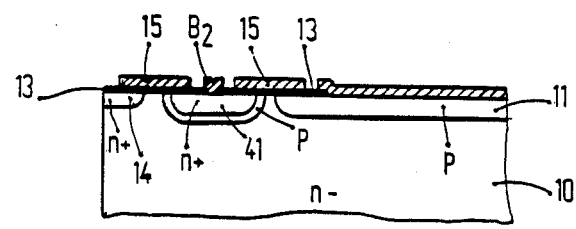

In the exemplary embodiment of FIGS. 5 and 6, the portion of the ohmic voltage divider resistor 16a formed by the zone 116a which is located in the upper left corner of FIG. 3 is replaced with a chain of Zener diodes $Z_1$, $Z_2$, $Z_3$. These Zener diodes each comprise one zone 40 with p conductivity introduced by diffusion into the main surface of the semiconductor chip 10 and one zone 41 with n+ conductivity introduced into this zone 40 by diffusion. In the vicinity of the Zener diodes $Z_1$, $Z_2$, $Z_3$, a recess 31 is provided in the metallizing coating 15, inside which recess the Zener diodes $Z_1$, $Z_2$, $Z_3$ are interconnected by means of metallizing bridges $B_1$, $B_2$. Inside the recess 31, the last Zener diode $Z_3$ of the chain $Z_1$, $Z_2$, $Z_3$ is also connected by means of a further metallizing bridge $B_3$ with a portion of the stop ring 14. The connections are each so formed that the metallizing bridges $B_1$, $B_2$, $B_3$ are bonded via contact windows disposed in the passivation layer 13 to the corresponding areas located therebeneath.

In the exemplary embodiment shown in FIGS. 5 and 6, in which a portion of the ohmic voltage divider resistor 16a is replaced by a chain of Zener diodes $Z_1$, $Z_2$, $Z_3$, the p-conductive zones 40 of these Zener diodes are introduced by diffusion simultaneously with the p zone 11 and the p zone 116a, while the n+ zones 41 are introduced by diffusion simultaneously with the n+ zone 14 defining the space charge zones of the main junction 12 (or simultaneously with the emitter zone, in the case of an n-p-n transistor). The breakdown voltage of the Zener diodes $Z_1$, $Z_2$, $Z_3$ is on the order of magnitude of 10 V.

In order to adjust the blocking voltage of the main junction 12, the Zener diodes $Z_1$, $Z_2$, $Z_3$ can be short-circuited individually, for instance by the brief application of a high blocking voltage, combined with a high blocking current.

Naturally the number of balancing routes is not limited to those of the exemplary embodiments, and the balancing methods described may be combined with one another as needed.

As already indicated, the invention is not restricted to the exemplary embodiments described in terms of the drawing and each of which relates to a diode. Instead, the invention relates generally to the influencing of the blocking behavior of an individual p-n junction. This may accordingly also be the base-collector junction of a transistor.

I claim:

1. A planar semiconductor structure having a monocrystalline semiconductor chip (10) of a basic material having a specific conductivity type and having a main surface,
   a first zone (11), of the opposite conductivity type, introduced by diffusion into the first semiconductor chip (10) from one main surface, which first zone, together with the basic material making up the semiconductor chip (10), prior to said diffusion, forms a first p-n junction (12) having a line of intersection with said main surface,
   a second, annular zone (14), of the same conductivity type as the basic material making up the semiconductor chip (10) but having a higher concentration of impurities, introduced around the first zone (11) by diffusion into the semiconductor chip (10) from said main surface,
   a passivation layer (13) covering said main surface of the semiconductor chip (10) except for contact windows (301, 302, 303) disposed respectively on each of said first (11) and second (14) zones,
   a metallizing coating (15), annularly surrounding the first p-n junction (12) and overlapping the line of intersection thereof with said one main surface of the semiconductor chip (10), applied, acting as a cover electrode (15), to the passivation layer (13), the metallizing coating extending across said one main surface as far as a region of said one main surface adjacent to the annular zone (14), and
   wherein, in accordance with the invention,
   the second annular zone (14) acts as a stop-ring and is completely covered by the passivation layer (13),
   a voltage divider (16) is provided, for adjusting the potential of the cover electrode (15) to a value which is substantially constant over the region of the cover electrode such that said value falls in a range between a potential of the first zone (11) and a potential of a portion of the semiconductor chip (10) located outside of the first zone (11), said portion having a conductivity type opposite that of the first zone (11), said voltage divider (16) including a voltage divider resistor (16a) having first (19) and second (20) ends, and a tap (16b) connected to the cover electrode (15),
   the first end (19) of the voltage divider resistor (16a) is connected with the first zone (11); and
   the second end (20) of the voltage divider resistor (16a) is connected (M1, M2; B1, B2) on said main surface with said portion of the semiconductor chip (10) located outside the first zone (11) and having a conductivity type opposite that of the first zone (11).

2. A semiconductor structure as defined by claim 1, wherein the voltage divider (16) is monolithically integrated with said first and second zones in said semiconductor structure.

3. A semiconductor structure as defined by claim 2, characterized in that the voltage divider resistor (16a) is at least partially an ohmic resistor.

4. A semiconductor structure as defined by claim 3, characterized in that
   the voltage divider resistor (16a) includes an elongated third zone (116a), of the same conductivity type as the first zone (11), introduced by diffusion into the semiconductor chip (10) from said main surface,
   wherein the third zone (116a) forms an extension of the first zone (11) and is at least partially covered by the passivation layer (13) and by the metallizing coating extending therebeyond and acting as a cover electrode (15), and
   that at a selected location (122a) on said main surface contiguous to the third zone, the passivation layer

(13) is removed, beneath said metallizing coating (15) acting as the cover electrode, a portion of the cover electrode (15) coming to rest inside the contact window (122a) thus formed, thereby forming the tap (16b) of the voltage divider (16).

5. A semiconductor structure as defined by claim 4, characterized in that the voltage divider (16) is a purely ohmic voltage divider and that the third zone (116a) embodies the entire voltage divider resistor (16a).

6. A semiconductor structure as defined by claim 5, characterized in that the second end (20) of the voltage divider resistor (16a) embodied by the third zone (116a) is connected, by means of a metallizing coating (22) carried beyond the passivation layer (13), with a portion of the semiconductor chip (10) which has a conductivity opposite that of the first (11) and third (116a) zones, preferably with a portion of the stop ring (14), in such a manner that this metallizing coating (22) is bonded via contact windows (22a) disposed in the passivation layer (13) to the areas (20, 14) located beneath these windows and which are to be connected with one another.

7. A semiconductor structure as defined by claim 5, characterized in that a recess (30) is disposed over one portion of the third zone (116a) in the metallizing coating acting as the cover electrode (15), said recess exposing the passivation layer (13), that contact windows (301, 302, 303) which are disposed in a row in the longitudinal direction of the third zone (116a) are disposed in the portion of the passivation layer (13) exposed by the recess (30), that these contact windows (301, 302, 303) are bridged over by a short-circuiting metallizing coating (M), which short-circuits the portions of the third zone (116a) located between the contact windows (301, 302, 303), and that the voltage divider (16) can be balanced by means of severing individual pieces ($M_1$, $M_2$) of this short-circuiting metallizing coating (M), in order to adjust the breakdown voltage at the first p-n junction (12) to a desired value.

8. A semiconductor structure as defined by claim 3, characterized in that the voltage divider resistor (16a) comprises an ohmic resistor and a chain of Zener diodes ($Z_1$, $Z_2$, $Z_3$) connected in series with this resistor and with one another.

9. A semiconductor structure as defined by claim 5, characterized in that the Zener diodes ($Z_1$, $Z_2$, $Z_3$) each comprise one zone (40) introduced by diffusion into said main surface of the semiconductor chip (10) and having the same conductivity type as the first (11) and third (116a) zones and one zone (41) introduced by diffusion into this zone (40) and having the same conductivity type as the basic material making up the semiconductor chip (10) but having a higher concentration of impurities, that in the vicinity of the Zener diodes ($Z_1$, $Z_2$, $Z_3$) a recess (31) is provided in the metallizing coating (15) acting as the cover electrode, inside which recess the Zener diodes ($Z_1$, $Z_2$, $Z_3$) are connected with one another by metallizing bridges ($B_1$, $B_2$) and inside which the last Zener diode ($Z_3$) of the chain ($Z_1$, $Z_2$, $Z_3$) is connected by means of a further metallizing bridge ($B_3$) with a portion of the semiconductor chip (10) which has a conductivity type opposite that of the first (11) and third (116a) zones, preferably with a portion of the stop ring (14), these metallizing bridges ($B_1$, $B_2$, $B_3$) being bonded via contact windows disposed in the passivation layer (13) with the corresponding areas located thereberneath.

10. A semiconductor structure as defined by claim 9, characterized in that the voltage divider (16) can be balanced by means of the short-circuiting of individual Zener diodes ($Z_1$, $Z_2$, $Z_3$) in order to adjust the breakdown voltage at the first p-n junction (12) to a desired value.

11. A semiconductor structure as defined by claim 10, characterized in that the Zener diodes ($Z_1$, $Z_2$, $Z_3$) can be short-circuited by means of the brief application of a high blocking voltage, combined with a high blocking current.

* * * * *